(12) United States Patent
Hammer et al.

(10) Patent No.: US 9,984,849 B2
(45) Date of Patent: May 29, 2018

(54) ELECTRON BEAM SPLITTER

(71) Applicant: FRIEDRICH-ALEXANDER-UNIVERSITÄT ERLANGEN-NÜRNBERG, Erlangen (DE)

(72) Inventors: Jakob Hammer, München (DE); Peter Hommelhoff, Erlangen (DE)

(73) Assignee: Friedrich-Alexander-Universität Erlangen-Nürnberg, Erlangen (DE)

( * ) Notice: Subject to any disclaimer, the term of this patent is extended or adjusted under 35 U.S.C. 154(b) by 26 days.

(21) Appl. No.: 15/302,505

(22) PCT Filed: Jun. 30, 2014

(86) PCT No.: PCT/EP2014/001784
§ 371 (c)(1),
(2) Date: Oct. 7, 2016

(87) PCT Pub. No.: WO2016/000726
PCT Pub. Date: Jan. 7, 2016

(65) Prior Publication Data
US 2017/0025242 A1 Jan. 26, 2017

(51) Int. Cl.
*H01J 37/147* (2006.01)

(52) U.S. Cl.
CPC ...... *H01J 37/1472* (2013.01); *H01J 37/1471* (2013.01); *H01J 2237/2614* (2013.01)

(58) Field of Classification Search
CPC ............... H01J 37/1471; H01J 37/1472; H01J 2237/2614
See application file for complete search history.

(56) References Cited

U.S. PATENT DOCUMENTS

| | | | | |
|---|---|---|---|---|
| 4,935,625 A | * | 6/1990 | Hasegawa | ............... G03H 5/00 250/311 |
| 6,181,059 B1 | * | 1/2001 | Beeteson | ............... H01J 29/68 313/422 |
| 2008/0302965 A1 | | 12/2008 | Harada et al. | |

OTHER PUBLICATIONS

International Search Report and Written Opinion; dated Mar. 24, 2015 for PCT Application No. PCT/EP2014/001784.
Hoffrogge, Johannes, and Peter Hommelhoff. "Planar microwave structures for electron guiding." New Journal of Physics 13.9 (2011): 095012.

(Continued)

*Primary Examiner* — Eliza Osenbaugh-Stewart
(74) *Attorney, Agent, or Firm* — Mendelsohn Dunleavy, P.C.; Steve Mendelsohn (57) ABSTRACT

The invention relates to an electron beam splitter (1) comprising a multi-pole electrode arrangement with a high-frequency alternating current voltage (5), which extends along a specified path (6) from an inlet side (9) to an outlet side (10), wherein the electrode arrangement (5) generates on the inlet side (9) with a first number of electrodes (7) impacted by the voltage a first oscillating electric field (61), which forms on a transversal plane a single local confinement minimum (62) in a time-averaged manner, and wherein the electrode arrangement (5) generates at least on the outlet side (10) with a second number of voltage-impacted electrodes (7) a second oscillating electric field (65), which forms at least two local confinement minimums (66, 67) in a time averaged manner.

25 Claims, 4 Drawing Sheets

(56) References Cited

OTHER PUBLICATIONS

Hänsel, W., et al. "Trapped-atom interferometer in a magnetic microtrap." Physical Review A 64.6 (2001): 063607.
Wesenberg, Janus H. "Ideal intersections for radio-frequency trap networks." Physical Review A 79.1 (2009): 013416.

* cited by examiner

ELECTRON BEAM SPLITTER

The invention relates to an electron beam splitter. A similar electron beam splitter is an essential component of electron optics and it is used for example in electron microscopy. The above-mentioned electron beam splitter is suitable in particular for manipulating electrons with energy in the range between 1 eV and 10 eV, such as those used in low-energy microscopy, or in future commercial electron microscopes with a reduced radiation exposure of the tested sample. The energy range specified above is of particular interest especially for examination of biological samples.

In the classical electron optics, electron beams are used so that they are focused transversely based on their electric charge by means of static electric and/or magnetic fields. Due to the short Broglie wavelength of electrons affected by mass, it is possible to perform operations at the highest resolution by means of electron microscopy. In modern transmission electron microscopes, for example a sub-atomic resolution is possible. A beam splitter is thus a crucial component in each testing setup, based on the interference of light or material waves. Material wave interference is employed in electron microscopy for example for measuring the average median potential of a sample and determining the thickness of the sample, in the measurement of contact potentials, in the measurement of magnetic flux and of magnetic domains, in the measurement of electric and magnetic fields, in the measurement of surface areas, in the measurement of coherence and of the directional beam value of an electron source in electron holography, as well as in the measurement of interference lithography.

The electron holography field was originally emphasized in order to operate electron microscopy at high resolution and thus to avoid complicated and costly imaging corrections required for electron optics.

At this point, electron holography is of particular interest for commercial manufacturers because the samples are in this case exposed to a reduced radiation dose. An electron beam splitter of the type mentioned above play a decisive role in this respect.

In many currently available commercial electron microscopes utilizing the material wave interference, a so called electrostatic biprism is used so that a an electron beams is diffracted on a charged biprism string. However, during the splitting of an electron beam with the electrostatic biprism, it is unavoidable that a certain amount of the electron beam finds the biprism string and is therefore lost. Other approaches to an electron beam splitter involve diffraction by a crystal, in which case, however, losses will occur in the higher diffraction ranges. In addition, high stability requirements must be met. Only a small splitting of the electron field is achieved. The disadvantage of splitting of the electron beam by means of a double gap is that this results in a low transmission. It is difficult to determine a magnetic biprism. Moreover, the transmission of electrons through a magnetic material is reduced, which results in a reduction of the coherence. Another approach is the use of an optical Kabitza-Dirac grating, wherein an electron beam is diffracted by a standing light wave. High technical requirements must be met also with this method. All of these approaches to an electron beam splitter have the disadvantages that they are not very robust, while they are also very sensitive to external interferences.

An important requirement for an electron beam splitter is in particular that it should be possible to place a sample in an arm of an interferometer. A large splitting of the electron beam is thus required, at least in the range of a few µm. In the case of technically employed electrostatic biprisms, some biprism lines are often aligned with one another and used in succession in order to achieve splitting of some 10 µm.

The object of the invention is to provide an electron beam splitter using splitting that is as free of loss as possible.

Further, the electron beam splitter should make it possible to enable as large splitting of the electron beams as possible, and it should also be robustly resistant to external interferences.

This object is achieved in accordance with the invention by an electron beam splitter which comprises a multi-pole electrode arrangement which extends along a specified path from the inlet side to the outlet side, wherein the electrode arrangement at the inlet side generates with a first number of electrodes impacted by voltage a first oscillating electric field, forming in a transverse plane in a time-averaged manner a single local confinement minimum, and wherein the electrode arrangement generates at least on the outlet side with a second number of electrodes impacted by voltage a second oscillating electric field, which forms at least two local confinement minima in a transverse plane.

The specified electron beam splitter combines the classical electron optics with the functional principle of a linear Paul trap. The linear Paul trap is based in particular on alternating electric quadrupole fields. A stable transverse inclusion of charged particles can be generated by means of rapidly oscillating fields, which can be described as a time-averaged pseudo potential (Nobel Prize in Physic awarded to Wolfgang Paul in 1989). The principle of the linear Paul trap is now successfully used in mass spectrometers and ion traps.

In a first step, the invention is based on the idea that according to the principle of linear Paul trap, wherein an electron trap is created along a trajectory without the influence of oscillating field on the direction forward, or in the longitudinal direction of the electrons. In the transversal direction, the electrons and thus also the electron beams are locked in or localized. In the case of a quadrupole field, an approximately parabolic pseudo potential is created for the Paul trap, which has a single confinement minimum.

In a second step, the invention takes into account the fact that with the application of the idea of the Paul trap, the electrons can be guided along a trajectory determined by the electrode arrangement, in particular also adiabatically without energetic excitation, and therefore they can be conducted while remaining in the corresponding state.

In a third step, the invention further takes into consideration the fact that with multipole fields of a higher order, pseudo potentials can be also generated based on this principle, which can have two or more locally separated confinement minima in the transversal direction with respect to the trajectory. In particular, intersection regions can be generated by multipole fields of a higher order in the image with pseudo-potentials, which is pointed out for examples by J. H. Wesenberg, "Ideal intersections for radio-frequency trap networks" in Physical Review A 79, 01346 (2009).

Accordingly, according to the invention, an electron beam is guided with a first number of electrodes at the inlet side with a pseudo-potential from the first oscillating electric field having a single local minimum, while a second pseudo-potential is generated to guide the electrons with a second number of electrodes by means of a second oscillating electric field at the outlet side, which has at least two local minima in transversal direction. In particular, an oscillating electric field is generated along the path of an oscillating electric field whose multipole components of a higher order are increased in the direction of the movement of the electrons. In this manner, a crossing region can be generated in the pseudo-potential, and therefore in particular a crossover of individual guided electron trajectories can be created in at least two guided individual trajectories, whereby an electron beam splitter is realized.

As was already mentioned, the pseudo-potential is created through a time-average by the oscillating electric field generated with the electrode arrangement. For electrons with energy between 1 eV and 10 eV, the frequency of the applied voltage is in the region from 500 MHz and 500 GHz, which is to say typically in the microwave region. Based on these assumptions, the potential which is seen as being generated by the electrons in the oscillating field can be described as quasi-static, which is to as a pseudo-potential. The alternating voltage applied to the electrode arrangement is preferable in the range of 1 V and 1,000 V.

Since the oscillating electric fields do not affect the electrons in the forward direction, namely because they form only a transverse confinement for the electron beam, the mentioned electron beam splitter operates essentially without a loss. A small portion of the energy directed forward must be converted only in the cross-section region, or in the region of the diffraction of the electron trajectory into a transversal component, which is why a barrier is provided for the electron in the forward direction. By creating the structure of the electrode arrangement, an oscillating field can be in particular generated on the outlet side of the electron beam splitter, so that local minima formed in the transverse direction are located at a distance in the range of several mms from each other. The mentioned electron beam splitter thus makes it possible to create a large splitting of the electron beam, which is particularly advantageous for interferometric applications.

This electron beam splitter enables in particular an adiabatic separation of the electron beam, whereby the electrons will be further guided after the separation in at least two individual trajectories in their basic state. In this context it is necessary to take into account the fact that the electrons should be exposed to as small impulse change as possible in the direction forward in the intersection region of the pseudo-potential. This can be achieved by optimizing the configuration of the electrodes for the purpose of a parallel splitting as much as possible.

It is preferred when the electrode arrangement is formed in such a way that in the crossover region of a single confinement minimum to two confinement minima, the opening angle α between both local confinement minima is between 0.005° and 0.04°. Experiments conducted for this purpose have shown that this angle range for kinetic energies between 1 eV and 10 eV of the electrons leads to an insignificant energy loss of the electrodes in the forward direction and thus is advantageous for an adiabatic splitting. At the same time, a smaller opening angle α should be selected the greater the kinetic energy of the electrons. Further experiments have shown that with respect to the adiabatic splitting, a kinetic energy between 1 eV and 10 eV is equally advantageous for electrons when the length of the electrode arrangement along the path is between 1 mm and 100 mm, preferably between 10 mm and 50 mm. At the same time, the length of the electrode arrangement should be greater the greater the kinetic energy of the electrons. Typical frequencies of the alternating voltage are in this case a few multiples of 10 GHz.

In yet another preferred embodiment of the electron beam splitter, the second number of the electrodes is increased relative to the first number of the electrodes. This makes it possible to take into account the increase of the multipole component of a higher order in the electric field in the direction forward, or along the path from the inlet side of the electron beam splitter to its outlet side.

It is preferred when the electrodes of the electrode arrangement are arranged and formed on the inlet side, so that they generate an oscillating electric field with a quadrupole component when a voltage is applied. This makes it possible to capture and align very well an electron beam generated by an electron beam source with the confinement of the quadrupole field, before the trapped and coupled electrons are in an intersection region with multipole components of a higher order. Aligning the electron trajectories by means of a one-side quadrupole field and thus with a transversal quadratic pseudo-potential also makes it possible to prevent individual electrons from leaving the confinement region along a part of the beam in the transverse direction, which is undesirable.

It is further also preferred when the electrodes of the electrode arrangement on the inlet side are consequently arranged and designed in such a way that an oscillating electric field is generated with a hexapole component, or with a multipole component of a still higher order, for example with an octopole component. A hexapole component is worthwhile only to the extent that the electron confinement created by the resulting pseudo-potential is higher the lower the multipole order. Since a hexapole field is the field of the lowest order which can be used to lower the pseudo-potential in a cross-section region, it is preferred when a hexapole field is created to form a partial beam region. It is also possible to create the desired pseudo-potential with a hexapole field after the cross-section region which has two local minima, wherein the electrodes are perceived approximately as a quadrupole field in the region of the minimum to the extent that they are transversely confined or securely guided in the longitudinal direction.

It is further also advantageous when the electrode arrangement on the outlet side is arranged and formed in such a way that it will generate an oscillating electric field with at least two quadrupole components that are mutually staggered in the transverse direction. This makes it possible to manipulate in a simple manner these at least two electron beam components, and in particular to separate them along the intended path. In this manner, it is then possible to achieve a large and particularly adiabatic splitting of the electron beams.

It is practical when the electrode arrangement is provided on the outlet side with a duplicate, at least a dual structure in the transverse direction on the inlet side. In other words, the outlet side is in particular a double structure of the inlet side, wherein the respective electrons of the beam components are guided for example longitudinally into the pseudo-potential of an oscillating quadrupole field.

In another preferred embodiment of the electron splitter, the electrode arrangement along the path comprises in a first group of electrodes a center electrode, as well as two accompanying electrodes flanking center electrode, and a second group of electrodes, wherein an intermediate electrode is arranged between an accompanying electrode and a center electrode, as well as two external electrodes which are arranged away from the center electrode relative to the accompanying electrodes, wherein the electrodes located inside a group are mutually connected, and wherein the electrodes of the first group and the electrodes of the second group are electrically insulated from each other. During operation, the electrodes of the first group and the electrodes of the second group are impacted by high-frequency alternating voltage. With this configuration of the electrodes which extend along the electron trajectory or along the predetermined path, it is possible to split the electron beam in the direction of the propagation in a desired manner with a transition of a quadrupole field through a hexapole field into separate quadruple fields, in particular coherently and/or adiabatically. For this purpose, the length of the center electrode is in particular reduced so that the intermediate electrodes are united into one electrode on the inlet side. In this manner, an electrode on the inlet side notices first a quadrupole field on the inlet side before it reaches an area with a multipole field of a higher order.

In a particularly preferred embodiment, the electrodes of the electrode arrangement are arranged on one surface, in particular on one plane. At the same time, the invention references in the illustration an example of a cylindrical multipole arrangement on one surface or level, wherein the closed multipole arrangement is conceptually separated in the longitudinal direction in one pole and unrolled on one surface or one level. It can be shown that with this conformal illustration of the transversal confinement described by the pseudo-potentials, one electron will remain in the vicinity of the potential minimum. The respective local confinement minima determined by the pseudo-potentials, which are respectively above the surface of above the plane, are typically in a range from a few multiples of 100 µm. In other words, the electrons are guided with an unrolled electrode arrangement at a distance from this longitudinal line.

The arrangement of the electrode at a surface, which can be in particular also curved or folded, makes it possible to manufacture a flat structural component, in particular in the form of a structured microwave substrate or the like. A similar structural component or a similar beam splitter chip is suitable for a modular application in an electron microscope. Its design can be adapted to the particular design determined by the local geometrical data.

It is advantageous when the electrodes themselves are arranged on a substrate as respective conductive layers. In this case it is preferred when the substrate is provided with a conductive coating on both sides. The electrodes of the second group are then advantageously formed as a contiguous, electrically conductive layer, in which the layer of the electrode of the first group is electrically insulated and embedded.

In other words, the electrodes can be designed according to the construction described above as a conductive, coated substrate. For example copper or gold can be employed for microwave applications as a conductive coating. A suitable substrate is characterized by a relatively low dielectric constant and by a small microwave loss factor. For a substrate that is suitable can be used for example a Teflon laminate. The coating on both sides of the substrate makes it possible to provide a high conductivity on both sides of the electrodes, for example with through-contacts, which is desirable in view of the current flow.

With regard to the configuration of the electrode arrangement, it has also proven expedient when the accompanying electrodes are on the inlet side outwardly open through the center electrode by creating the beak form. This configuration makes it possible to capture electron beams originating from an external electron source in the inlet trajectory of the electron beam splitter. It has been proven in particular that the electric stray fields are reduced in this manner and that the deflection of the electron trajectory and/or excitement of the electrons caused in this manner can be suppressed.

Secure guiding of the electrons into the desired quadrupole field can thus be achieved as a result of the joint guiding of the intermediate electrodes on the inlet side.

In another preferred variant, the center electrode of the electron beam splitter is bifurcated on the outlet side. With this bifurcation, the two electron trajectories are eventually guided apart from each other so that a large splitting of electron beam is enabled.

It has further proven as advantageous when the center electrode is provided with a smaller transverse width relative to the accompanying electrodes from the inlet side to the outlet side along most of its total length. A separation will thus be achieved for an incoming electrode lasting over as long period of time as possible. In other words, a relatively low potential is built slowly in the forward direction for an incoming electron, so that an adiabatic splitting can be reached as much as possible. It is in this case particularly advantageous when the center electrode is continuously tapered off from the outlet side to the inlet side. The electron is guided in this manner from a quadrupole field with a pseudo-potential which has a parabolic form, which is to say over a "gentle" crossover region, into a hexapole field with two local confinement minima which are separated from each other. The center electrode is preferably extended up to the vicinity of the inlet side. The thickness of the center electrode on its front end is in this case minimized within the predetermined manufacturing limits.

If is further also advantageous when the transversal width of the accompanying electrodes is changed in the area of the inlet side along the path with a varying slope. The variation of the slope is again advantageous in order to reduce the loss of electrons or to reduce the deflection of the electron trajectory. The trajectories of the injected electrodes are thus also parallelized as quickly as possible. Advantageously, the transversal width of the accompanying electrodes is increased and decreased in sections in this region.

Accordingly, the transversal width of the accompanying electrodes is changed in a region on the outlet side with its varying slope. It is in this case advantageous when the transversal width of the accompanying electrodes is also increased and decreased in the section in the area on the outlet side.

For practical purposes, the transversal width of the accompanying electrode is substantially identical in one central section of the electrode arrangement. The energy of the electrons can be also taken into account over the length of the central section.

Embodiments of the invention will now be explained in detail with reference to the drawings, which show the following.

Figure 1:
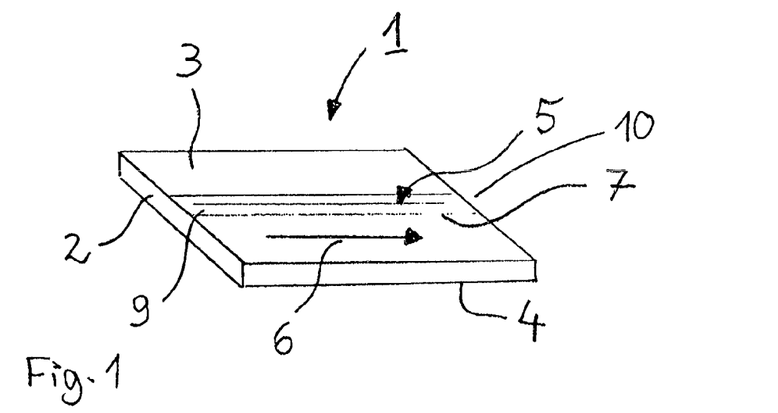
FIG. 1 an electron beam splitter shown in a schematic top view on a substrate.

FIG. 1 shows schematically an electron beam splitter 1, which is formed on a planar substrate 2. The substrate 2 is a substrate that is suitable for microwave applications and in particular, the substrate 2 is manufactured from a Teflon laminate. On its upper side is attached for example a conductive layer 3 which is made from copper/gold. However, it is also possible to use another substrate 2 which has a lower dielectric constant and a small microwave loss factor. For conductive coatings should be selected materials that have a high conductivity. A suitable conductive layer 4 is provided also on its lower side. An electrode arrangement 5 is formed on the upper side by chemical etching that is applied to the respective contours of the conductive layer 3, which forms the actual electron beam splitter 1. The electrode arrangement 5 extends in this case along its path 6, which at the same time substantially indicates the direction of the movement or of the trajectory of the electron beams to be split. The individual electrodes 7 of the electrode arrangement 5 are only suggested in the figure. The electrode arrangement 5 extends from an inlet side 9 to an outlet side 10.

Figure 2:
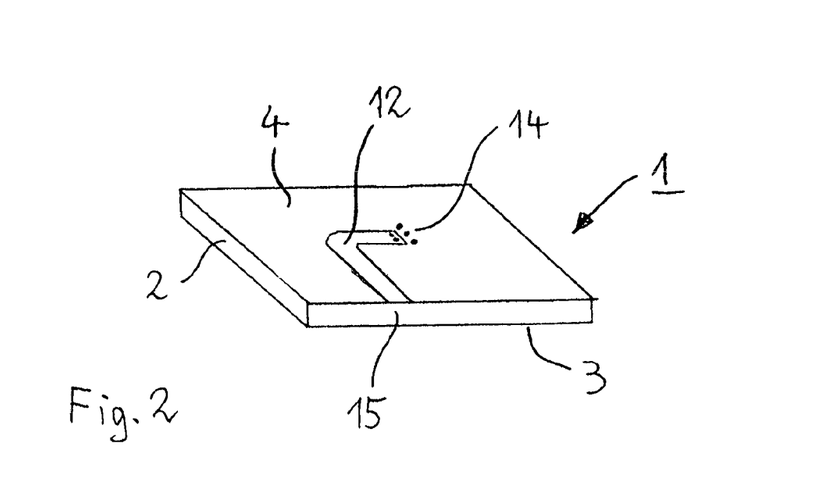
FIG. 2 an electron beam splitter according to FIG. 1 seen from below.

FIG. 2 shows the electron beam splitter 1 according to FIG. 1 from below. A microwave line 12 is formed with chemical etching of the contour line in the conductive layer 4 on the lower side of the substrate 2. At the end of the microwave line 12 are arranged through-contacts 14, which are in contact both with the microwave line 12 and with the conductive layer 4 on the opposite side of the corresponding electrodes 7 of the electrode arrangement 6. At the outer end of the microwave line 12 is located a connection side 15 for connecting a suitable RF source. The RF signal is in this case fed into the microwave line 12. The surrounding conductive layer 4 on the lower side and the surrounding conductive layer 3 on the upper side are in contact with the ground.

Figure 3:
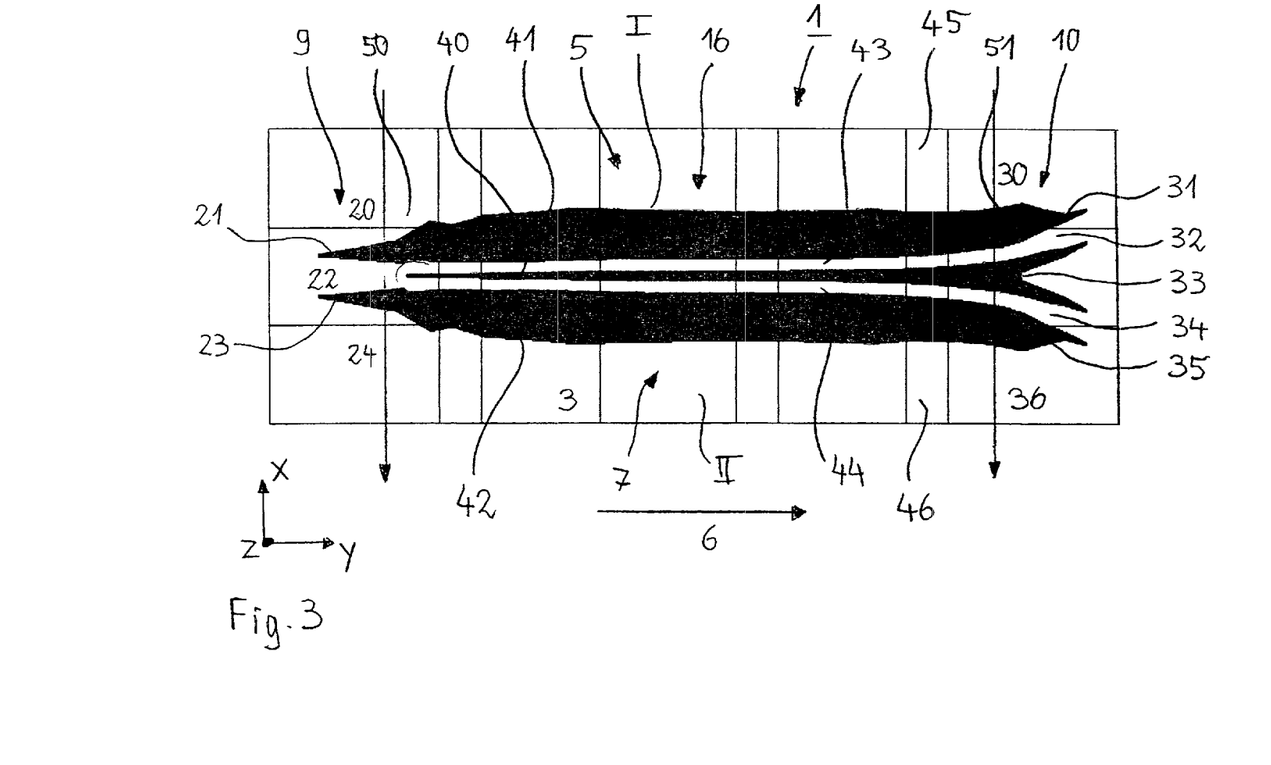
FIG. 3 the electrode arrangement of a planar electron beam splitter shown in detail, FIG. 4 pseudo-potentials generated by the electrode configuration according to FIG. 3 in the area of the inlet side and in the area of the outlet side, FIG. 5 the course of an isopotential surface along its electrode arrangement according to FIG. 3, and FIG. 6 probable stops for electrons in the basic state along the intersection area of the pseudo-potential of an electrode configuration that is similar to FIG. 3.

FIG. 3 shows in detail a view of a possibly loss-free splitting of the electrons of an optimized electrode arrangement 5 of an electron beam splitter 1. In accordance with FIG. 1, the electrode arrangement 5 extends along a path 6 from an inlet side 9 to an outlet side 10. This is indicated in FIG. 3 by the spatial directions X, Y, Z of a Cartesian coordinate system. The electron beam to be split is fed in from the left side, it crosses the electrode arrangement 5 in the Y direction and leaves it with two split partial beams at the output side 10. Between the inlet side 9 and the outlet side 10, the electrode arrangement 5 is provided with a center region 16, whose length is determined relative to the longitudinal electron energy and which enables splitting of the electron beam with as small transversal excitement as possible.

The electrode arrangement 5 is flat and it is formed in particular on a flat substrate 2 according to FIGS. 1 and 2. The individual electrodes 7 are formed in the conductive layer 3 on the upper side of the substrate 2 in such a way that the conductive layer 3 is removed with chemical etching along their separation contours. The different coloring of the electrode serves only to enable better visualization.

In a first view is shown the electrode arrangement 5 on the inlet side in the direction of a first electrode 20 indicated by the arrow, as well as a fourth electrode 23 and a fifth electrode 24. These electrodes, namely a total of five electrodes 20-24, constitute an electric quadrupole unrolled onto one plane. The respective electrodes 20-24 are adjacent in the direction of the arrow and they are located on a different potential. When the electrodes 20-24 are impacted by a high-frequency alternating voltage, this will result in an oscillating quadrupole field, which leads to a time-averaged pseudo-potential having two local central confinement minima on the X, Z plane above the center electrode 22. A transverse confinement of the electrons occurs due to this pseudo-potential in the direction of the path 6.

On the outlet side 10, and also in the center region 16, are arranged along the direction indicated by the arrow a first electrode 30, a second electrode 31, a third electrode 32, a fourth electrode 33, a fifth electrode 34, a sixth electrode 35, and a seventh electrode 36. Adjacent electrodes 30-36 are on the other hand located on a different potential. This configuration thus corresponds to a hexapole unrolled on one plane. When a voltage is applied, the electrode 30-36 generate on the outlet side an oscillating hexapole field whose time-averaged pseudo-potential displays two confinement minima spaced in the transversal direction, which lie respectively in the Z direction above the third electrode 32, or above the fifth electrode 34. The electrodes are thus guided longitudinally to each other with the spaced trajectories on the outlet side in transversal direction. The resulting pseudo-potential from the hexapole field leads to a longitudinal guidance along the predetermined trajectories.

A continuous and substantially parallel crossover is reached for electrons above the center region 16 from a single guided confinement trajectory in two guided confinement trajectories. A single electron will so far not be substantially slowed down in the direction of propagation and it will remain in its transversal basic state. In the quantum mechanical picture, there is an equal probability that the electron will remain in both trajectories on the outlet side.

If the given electrode assembly 5 is considered to be geometrical along the path 6, then one can detect in the first group I (dark color) a center electrode 40, as well as respective accompanying electrodes 41, 42 disposed along the path 6. In a second group II (white color), one can detect between the center electrode 40 and respective accompanying electrodes 41 and 42 that intermediate electrodes 43, 44 are arranged there along with two external electrodes 45 and 46. At the same time, the electrodes 40, 41, 42 (dark color) of the first group I are connected with one pole and the electrodes 43, 44, 45 36 (white color) of the second group II to the other pole of the voltage source.

The electrodes 44, 44, 45, 46 of the second group II can be detected immediately as a conductive layer 3 which is still contiguous. The electrodes of the first group I are developed from a conductive layer with chemical etching of their contours.

It is evident that both accompanying electrodes 41, 42 are opened forward with the shape of a beak. Moreover, their transversal width varies along the path 6 in the area of the inlet side 9. Increased and decreased width is also visible in other sections. The injection of an electron beam which originates in an external source of electrons is thus facilitated in this manner. In particular, undesirable electric stray fields are thus suppressed.

The electrode arrangement 5 is provided on the outlet side 10 with a substantially transversal double configuration relative to the inlet side 9. The center electrode 40 is bifurcated in this location for the separation of the separated trajectories.

Both center electrodes 43, 44 have a uniform transversal width from the inlet side 9 to the outlet 10, with the possible exception of the bifurcating region. The center electrode 40 is monotonically tapered off in the illustrated example from the outlet side 10 in the direction toward the outlet side. The transversal width of the center electrode 40 is formed with a smaller transversal weight along a significant part of its total length from the inlet side 9 to the outlet side 10 with the opposite accompanying electrodes 41, 42. In the center region 16, the transversal width of both accompanying electrodes 41, 42 remains substantially the same.

The electrode arrangement illustrated in the figure has a total length of approximately 40 mm. On the outlet side 9, both electrode trajectories are separated by 2 mm from each other. For electrons, a largely loss-free splitting of the electron beam was indicated with energy in the range from 0.5 eV to 3.5 eV and with an alternating voltage frequency of 1 GHz. This has shown that a this arrangement or a similar electrode arrangement is essentially capable to cause an adiabatic and coherent splitting of electrons when the alternating voltage frequency of 10 GHz is selected, with a kinetic energy of the electrons of 1 eV and a voltage of 100 V.

Figure 4:
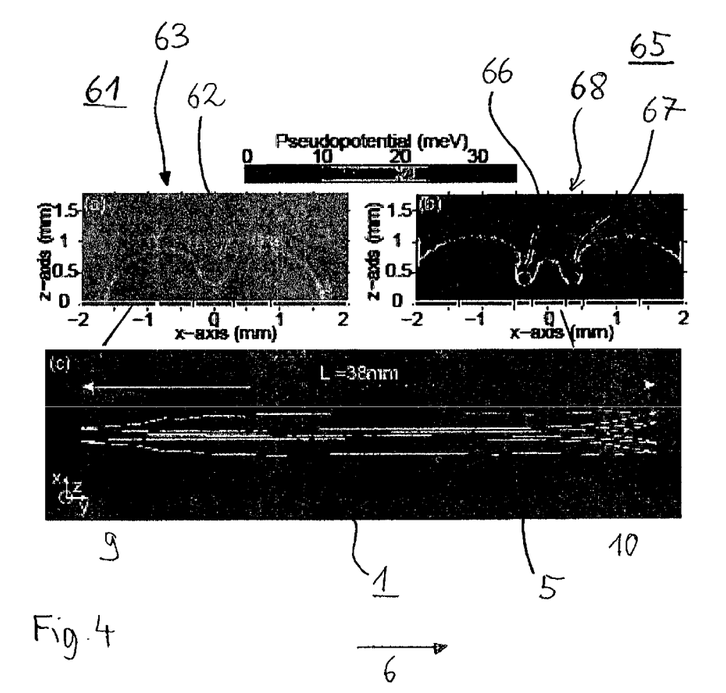

FIG. 4 illustrates the electrode configuration 5 shown in FIG. 3 with the resulting time-averaged electric fields 61, 65 and pseudo-potentials 63, 68 on the inlet side 9 and on the outlet side 10. The pseudo-potential 63 resulting from the oscillating electric field 61 on the inlet side has a single local confinement minimum 62. The surrounding potential is formed with a substantially parabolic shape in the transverse direction. The local confinement minimum 62 is formed approximately 500 µm above the electrode arrangement 5.

The pseudo-potential 68 resulting from the oscillating electric field 65 on the outlet side of the electrode arrangement 5 displays two confinement minima 66, 67, which are mutually separated from each other by a range of several mm and arranged approximately 400µ above the electrode arrangement 5.

In particular, the resulting local confinement minima 62, 65, 67 are electrons which are transversally confined and longitudinally guided in the direction of the path 6.

Figure 5:
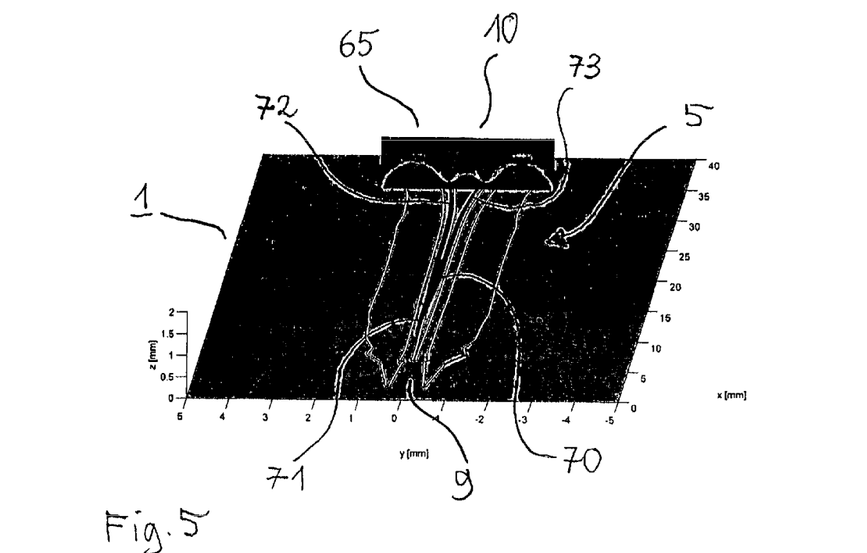

In FIG. 5 is illustrated an isopotential 70 which is shown along the pseudo-potential resulting from the electrode arrangement 5. On the inlet side 9 is a single branch 71. The branch 71 is split along the electrode arrangement 5 into two separate branches 72 and 73. It is clearly indicated on the outlet side 10 how the separated branches 72, 73 are associated with both local confinement minima of the pseudo-potential 65.

Figure 6:
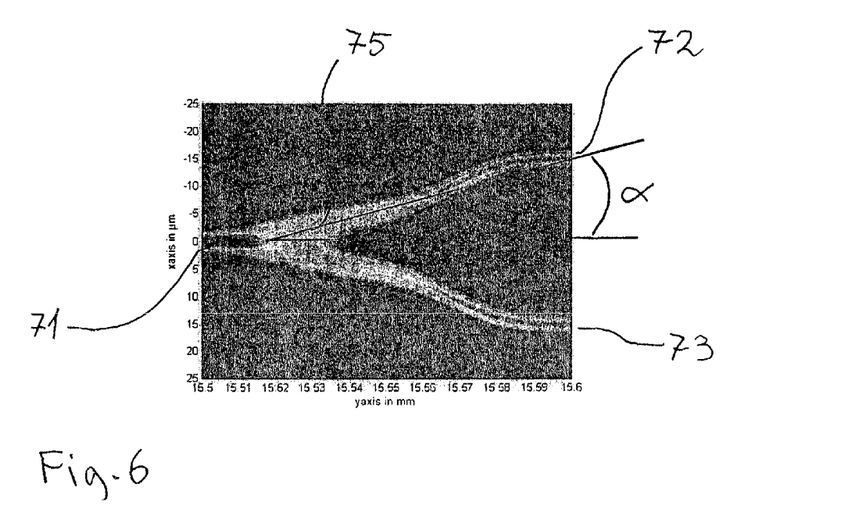

FIG. 6 shows an optimized crossover region 75 of an electron beam splitter, which can be seen for example with respect to the electrode arrangement 5 in a similar manner also in FIG. 3 or 5. The electron trapping probability is illustrated in this case from a quantum-mechanic perspective in the basic state. One can see that the electrons in a single branch 70 are in their basic state. Even after their separation, the electrons are in the respective branches 72, 73 in their basic state.

In the crossover region 75 is indicated the opening angle of the branches 72, 73 separated in the pseudo-potential. To achieve splitting that is as loss-free and adiabatic as possible, this angle should be between 0.005° and 0.04° with an electron energy from 1 eV to 10 eV.

As one can see from FIGS. 5 and 6, the crossover region is extended over a comparatively long distance. In other words, the splitting of the electrons takes place substantially in parallel manner. This makes it possible to achieve adiabatic and coherent splitting. This is achieved mainly with the center electrode 40, which is tapered in the forward direction as can be in FIG. 3, and with the relatively small opening angle α, which has the confinement minima 66, 67 for splitting, or the branches 72, 73 in the pseudo-potential.

LIST OF REFERENCE SYMBOLS 1 electron beam splitter
2 substrate
3 conductive layer, upper side
4 conductive layer, lower side
5 electrode arrangement,
6 path
7 electrodes
9 inlet side
10 outlet side
12 microwave feed
14 through-contacts
15 connection side
15 central region
20 electrode, inlet side
21 electrode, outlet side
22 electrode, inlet side
23 electrode, outlet side
24 electrode, inlet side
30 electrode, outlet side
31 electrode, outlet side
33 electrode, outlet side
34 electrode, outlet side
35 electrode, outlet side
36 electrode, outlet side
40 center electrode
42 accompanying electrode
43 intermediate electrode
44 intermediate electrode
45 external electrode
46 external electrode
50 outer contour
61 electric field
62 confinement minimum
63 pseudo-potential
65 electric field
66 confinement minimum
67 confinement minimum
68 pseudo-potential
70 electron trajectory
71 branch
72 branch
73 branch
75 crossover region

The invention claimed is:

1. Electron beam splitter comprising an electrode arrangement configured to be impacted by a multi-pole, high-frequency alternating voltage, wherein the electrode arrangement extends along a path from an inlet side to an outlet side, wherein:
   on the inlet side, the electrode arrangement is configured to generate a first oscillating electric field, which forms, in a transverse plane in a time-averaged manner, a single inlet-side confinement minimum, and
   on the outlet side, the electrode arrangement is configured to generate a second oscillating field, which forms, in a transverse plane in a time-averaged manner, at least two outlet-side confinement minima.

2. The electron beam splitter according to claim 1, wherein the electrode arrangement is formed in such a way that, in a crossover region from the inlet-side confinement minimum to the two outlet-side confinement minima, the opening angle α between the two outlet-side confinement minima is between 0.005° and 0.04°.

3. The electron beam splitter according to claim 1, wherein the length of the electrode arrangement along the path is between 1 mm and 100 mm.

4. The electron beam splitter according to claim 3, wherein the length of the electrode arrangement along the path is between 10 mm and 50 mm.

5. The electron beam splitter according to claim 1, wherein the electrode arrangement has fewer electrodes on the inlet side than on the outlet side.

6. The electron beam splitter according to claim 1, wherein the electrodes of the electrode arrangement on the inlet side are arranged and formed in such a way that, when the alternating voltage is applied, the electrodes generate an oscillating electric field with a quadrupole component.

7. The electron beam splitter according to claim 1, wherein the electrodes of the electrode arrangement in a crossover region from the inlet side to the outlet side are arranged and formed in such a way that they generate an oscillating electric field with either a hexapole component or a multipole component of a higher order.

8. The electron beam splitter according to claim 1, wherein the electrodes of the electrode arrangement on the outlet side are arranged and formed in such a way that they generate an oscillating electric field with at least two quadrupole components mutually staggered relative to each other in a transverse direction.

9. The electron beam splitter according to claim 8, wherein, on the outlet side, the electrode arrangement is provided with a double structure of the electrode arrangement on the inlet side in the transverse direction.

10. The electron beam splitter according to claim 1, wherein, in a center region along the path, the electrode arrangement comprises:
    a center electrode (40);
    a pair of intermediate electrodes (43, 44) flanking the center electrode;
    a pair of accompanying electrodes (41, 42) flanking the intermediate electrodes; and
    a pair of external electrodes (45, 46) flanking the accompanying electrodes, wherein:
        the center electrode and the accompanying electrodes form a first group of electrodes configured to be connected to a first pole of the alternating voltage; and
        the intermediate electrodes and the external electrodes form a second group of electrodes configured to be connected to a second, different pole of the alternating voltage.

11. The electron beam splitter according to claim 10, wherein the electrodes of the second group are formed as a contiguous, electrically conductive layer, so that the electrodes of the first group are electrically insulated and embedded in the layer.

12. The electron beam splitter according to one claim 10, wherein the accompanying electrodes are opened forward on the inlet side in the shape of a beak via the center electrode.

13. The electron beam splitter according to claim 10, wherein the intermediate electrodes on the inlet side are brought together.

14. The electron beam splitter according to claim 10, wherein the center electrode is bifurcated on the outlet side.

15. The electron beam splitter according to claim 10, wherein the center electrode has a smaller transversal width relative to the accompanying electrodes from the inlet side to the outlet side throughout most of its total length.

16. The electron beam splitter according to one claim 10, wherein the center electrode is continuously tapered off from the outlet side to the inlet side.

17. The electron beam splitter according to claim 10, wherein the transversal width of the accompanying electrodes is changed with a varying slope in a region on the inlet side along the path.

18. The electron beam splitter according to claim 17, wherein the transversal width of the accompanying electrodes is increased and decreased in sections in the region on the inlet side.

19. The electron beam splitter according to claim 10, wherein the transversal width of the accompanying electrodes is changed with a varying slope in a region on the outlet side along the path.

20. The electron beam splitter according to claim 19, wherein the transversal width of the accompanying electrodes is increased and decreased in sections in the region on the outlet side.

21. The electron beam splitter according to claim 10, wherein the transversal width of the accompanying electrodes remains substantially the same in the center region of the electrode arrangement.

22. The electron beam splitter according to claim 1, wherein the electrodes of the electrode arrangement are arranged on a planar surface.

23. The electron beam splitter according to claim 22, wherein the electrodes are respectively arranged as conductive layers on a substrate.

24. The electron beam splitter according to claim 23, wherein the substrate is coated so that it is conductive on both sides.

25. The electron beam splitter according to claim 1, wherein:
    the electrode arrangement is formed in such a way that, in a crossover region from the inlet-side confinement minimum to the two outlet-side confinement minima, the opening angle α between the two outlet-side confinement minima is between 0.005° and 0.04°;
    the length of the electrode arrangement along the path is between 10 mm and 50 mm;
    the electrode arrangement has fewer electrodes on the inlet side than on the outlet side;
    the electrodes of the electrode arrangement on the inlet side are arranged and formed in such a way that, when the alternating voltage is applied, the electrodes generate an oscillating electric field with a quadrupole component;
    the electrodes of the electrode arrangement in the crossover region from the inlet side to the outlet side are arranged and formed in such a way that they generate an oscillating electric field with either a hexapole component or a multipole component of a higher order;
    the electrodes of the electrode arrangement on the outlet side are arranged and formed in such a way that they generate an oscillating electric field with at least two quadrupole components mutually staggered relative to each other in a transverse direction;
    on the outlet side, the electrode arrangement is provided with a double structure of the electrode arrangement on the inlet side in the transverse direction;
    in a center region along the path, the electrode arrangement comprises:
        a center electrode;
        a pair of intermediate electrodes flanking the center electrode;
        a pair of accompanying electrodes flanking the intermediate electrodes; and
        a pair of external electrodes flanking the accompanying electrodes, wherein:
            the center electrode and the accompanying electrodes form a first group of electrodes configured to be connected to a first pole of the alternating voltage; and the intermediate electrodes and the external electrodes form a second group of electrodes configured to be connected to a second, different pole of the alternating voltage;
the electrodes of the electrode arrangement are respectively arranged as conductive layers on a planar substrate that is coated so that it is conductive on both sides;
the electrodes of the second group are formed as a contiguous, electrically conductive layer, so that the electrodes of the first group are electrically insulated and embedded in the layer;
the accompanying electrodes are opened forward on the inlet side in the shape of a beak via the center electrode;
the intermediate electrodes on the inlet side are brought together;
the center electrode is bifurcated on the outlet side;
the center electrode has a smaller transversal width relative to the accompanying electrodes from the inlet side to the outlet side throughout most of its total length;
the center electrode is continuously tapered off from the outlet side to the inlet side;
the transversal width of the accompanying electrodes is increased and decreased in sections in a region on the inlet side along the path;
the transversal width of the accompanying electrodes is increased and decreased in sections in a region on the outlet side along the path; and
the transversal width of the accompanying electrodes remains substantially the same in the center region of the electrode arrangement.

* * * * *